United States Patent
Kwon et al.

[11] Patent Number: 6,165,888
[45] Date of Patent: Dec. 26, 2000

[54] TWO STEP WIRE BOND PROCESS

[75] Inventors: Seok Mo Kwon; Si Hyun Choe, both of Kyongggi-do, Rep. of Korea

[73] Assignee: Motorola, Inc., Schaumburg, Ill.

[21] Appl. No.: 08/943,018

[22] Filed: Oct. 2, 1997

[51] Int. Cl.$^7$ .................................................. H01L 21/44
[52] U.S. Cl. .................... 438/617; 438/120; 438/612; 438/613; 228/180.5; 228/904
[58] Field of Search .................... 257/780, 784, 257/779, 785, 737, 738, 778; 438/613, 614, 617, 106, 120, 612, 615; 228/180.5, 904

[56] References Cited

U.S. PATENT DOCUMENTS

| | | | |
|---|---|---|---|
| 4,603,802 | 8/1986 | Kurtz et al. | 228/1.1 |
| 4,661,192 | 4/1987 | McShane | 156/292 |
| 4,907,734 | 3/1990 | Conru et al. | 228/123 |
| 5,014,111 | 5/1991 | Tsuda et al. | 257/737 |
| 5,201,454 | 4/1993 | Alfaro et al. | 228/110 |
| 5,249,450 | 10/1993 | Wood et al. | 72/359 |
| 5,293,073 | 3/1994 | Ono | 257/740 |
| 5,302,550 | 4/1994 | Hirota et al. | 438/106 |
| 5,421,503 | 6/1995 | Perlberg et al. | 228/4.5 |
| 5,550,407 | 8/1996 | Ogashiwa | 257/737 |
| 5,558,270 | 9/1996 | Nachon et al. | 228/180.5 |
| 5,633,204 | 5/1997 | Tago et al. | 438/614 |
| 5,740,956 | 4/1998 | Seo et al. | 228/180.22 |
| 5,871,141 | 2/1999 | Hadar et al. | 228/180.5 |
| 5,874,780 | 2/1999 | Murakami | 257/775 |
| 5,884,830 | 3/1999 | Yamazaki et al. | 228/1.1 |
| 5,938,105 | 8/1999 | Singh | 228/180.5 |
| 6,001,724 | 12/1999 | Stansbury | 438/617 |
| 6,041,995 | 3/2000 | Takahashi et al. | 228/164 |
| 6,080,651 | 6/2000 | Takahashi et al. | 438/617 |
| 6,098,868 | 8/2000 | Mae et al. | 228/102 |

FOREIGN PATENT DOCUMENTS

| | | |
|---|---|---|
| 59-191338 | 10/1984 | Japan . |
| 62-256445 | 11/1987 | Japan . |
| 3-027544 | 2/1991 | Japan . |
| 5-226400 | 9/1993 | Japan . |
| 8-008308 | 1/1996 | Japan . |

*Primary Examiner*—Olik Chaudhuri
*Assistant Examiner*—Alonzo Chambliss
*Attorney, Agent, or Firm*—Anthony M. Martinez

[57] ABSTRACT

A two step wire bonding process is used to ultrasonically attach a wire (18) to a contact pad (13) on a semiconductor device (10). A first step is used to flatten a rounded tip (19) of the wire (18), and to start the bonding process. This is accomplished by applying a relatively large force to the rounded tip (19), and a relatively low vibrating displacement to the flattened wire tip (19). During a second step the large force is reduced, however; the vibrating displacement is increased. The total time for the two step wire bonding process is slightly less than a prior art one step process.

2 Claims, 1 Drawing Sheet

TWO STEP WIRE BOND PROCESS

FIELD OF THE INVENTION

The present invention relates generally to semiconductor integrated circuits, and more particularly, to a wire bonded to the semiconductor integrated circuit.

BACKGROUND OF THE INVENTION

Bonding a wire to a surface of a semiconductor integrated circuit to make electrical contact to the integrated circuit is well known. Wire bonders are commonly used to accomplish the bonding. The wire bonders are capable of applying an ultrasonic energy and force to the wire. In other words, the wire bonders can apply an ultrasonic energy and force to the wire during the bonding process.

As the semiconductor substrates become thinner and as more fragile materials are used such as III–V materials, which are very brittle, the wire bonds are prone to failure or else the bonding process damages an unacceptable number of semiconductor die. The failure mechanism is a lifting of the wire bond or cracks forming in the semiconductor substrate itself. Cratering was noted on the contact pad of the semiconductor substrate from where the wire bond was lifted. There were also cracks around the edges of the crater. The wire bond failures are sometimes difficult to detect visually or during final electrical test since they seem to appear during temperature cycling tests or in actual use where they undergo normal temperature cycling.

The wire that is used to bond to the semiconductor device is very thin and typically has a rounded tip that is applied to the contact pad on the semiconductor device. A wire bonder is used to apply the thin wire with the rounded tip to the contact pad on the semiconductor device. The wire bonder is capable of applying a slight force, a vibrating frequency to the wire as contact is made to the contact pad, as well as controlling the vibrating displacement. The vibrating frequency causes the ultrasonic bonding. However, during the bonding process, the vibrating wire tends to wear or dig a crater into the contact pad. The cratering is believed to cause the failure.

Some solutions attempted in the past were to use a low vibrating displacement along with a low force or a medium vibrating displacement along with a higher force. However, other problems surfaced, such as poor bonds and low bond shear strength. One attempt to solve the problem proposed a thermocompression bond but this process took too long thereby increasing the manufacturing time. Another proposed solution was to increase the thickness of the bonding pad with the goal of preventing the cratering from causing the semiconductor substrate from cracking underneath the crater where the wire bond was made. But this proposed solution increased cost and also increased the process time.

Accordingly, the present invention overcomes the above problems and produces a reliable wire bond.

DETAILED DESCRIPTION OF THE DRAWINGS

It will be appreciated that for simplicity and clarity of illustration, elements illustrated in the Figures. have not necessarily been drawn to scale. For example, the dimensions of some of the elements are exaggerated relative to other elements for clarity.

Figure 1:
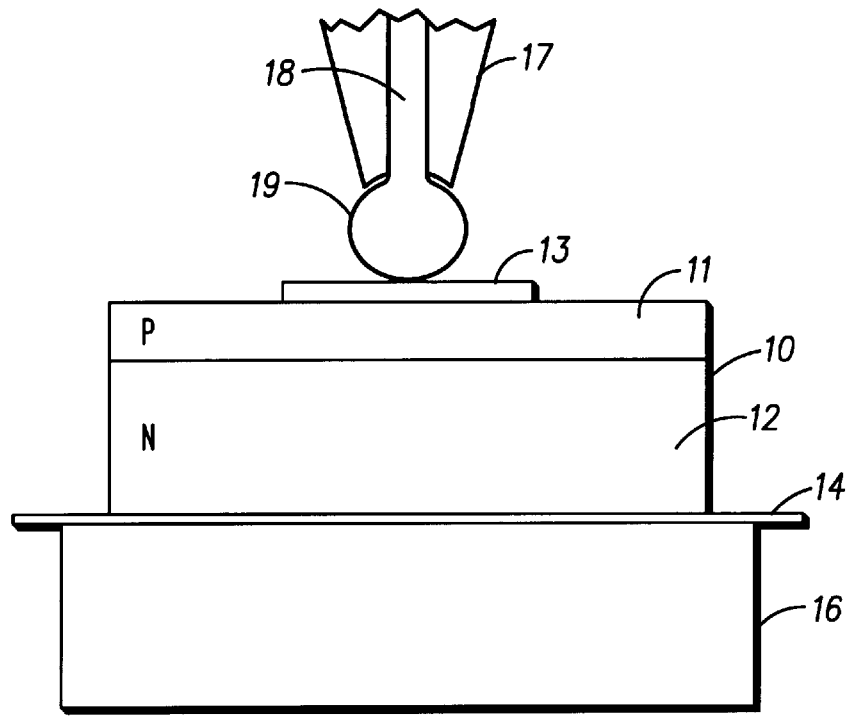
FIG. 1 is a pictorial representation of a starting point of the present invention.

Illustrated in FIG. 1 is a pictorial representation of the appearance of the present invention at the beginning of the two step wire bonding process. A semiconductor device 10, also commonly referred to as an integrated circuit, is attached to a leadframe 14. A thermal conductive epoxy (not shown) is normally used to attach semiconductor device or semiconductor substrate 10 to leadframe 14. Semiconductor device 10 is shown as having a N region 12 and a P region 11. In an optical device, P region 11 is the light emission region. A bonding or contact pad 13 is shown on a first surface of semiconductor device 10 and is used to provide electrical contact to semiconductor device 10. An electrical wire 18 will be attached by bonding to contact pad 13. Electrical wire 18 will provide an electrical path between semiconductor device 10 and leadframe 14. Typically electrical wire 18 is a gold alloy or gold wire of 2.54 micrometers in diameter, and after being threaded through capillary 17 a ball configuration 19 is formed on the end of wire 18. Ball 19 is formed by an electronic flame off process. A voltage is applied to wire 18 to generate a spark discharge which heats the tip of wire 18. The ball forms due to surface tension in the molten wire tip. Ball or rounded configuration 19 is the portion of wire 18 that gets bonded to contact pad 13. Leadframe 14 rests on a heat block 16, which is part of the wire bonding machine. Heat block 16 is used to apply heat to semiconductor device 10, which in turn heats up contact pad 13.

In the prior art one step process, capillary 17 was used to apply a slight pressure to ball 19 while vibrating it at a relatively high displacement for thirteen milliseconds. This caused wire 18 to bond to contact pad 13, while ball 19 substantially maintained its rounded configuration which by now had a diameter of approximately 7.62 micrometers. However, in the process a crater was formed in contact pad 13. On occasion this resulted in cracks being created in P region 11 at the perimeter of the crater. Once P region 11 cracks the semiconductor device is no longer functional. Many of these failures can be detected during electrical testing. However, some failures did not show up until after the semiconductor device 10 had been in an end user's environment and had undergone many temperature cycles.

The wire bonder used in the present invention is a Shinkawa Wire Bonder Model UTC 205 made by the Shinkawa Company of Tokyo, Japan. The vibrating power is a measurement of the displacement of capillary 17 during vibration, and is a linear correlation to a dial setting. The power setting used in the above prior art example was 56. The model UTC 205 vibrates at 62.5 Khz, and also includes heat block 16. Heat block 16 maintains a temperature of approximately 240 degrees centigrade.

The first step of the present two step wire bonding process entails applying approximately 90 grams of force on ball 19, while heating semiconductor device 10 with heating block 16. At the same time capillary 17 is vibrated at a relatively low power setting for approximately six milliseconds. The preferred power setting was found to be approximately 40. These conditions are maintained for approximately six milliseconds.

Figure 2:
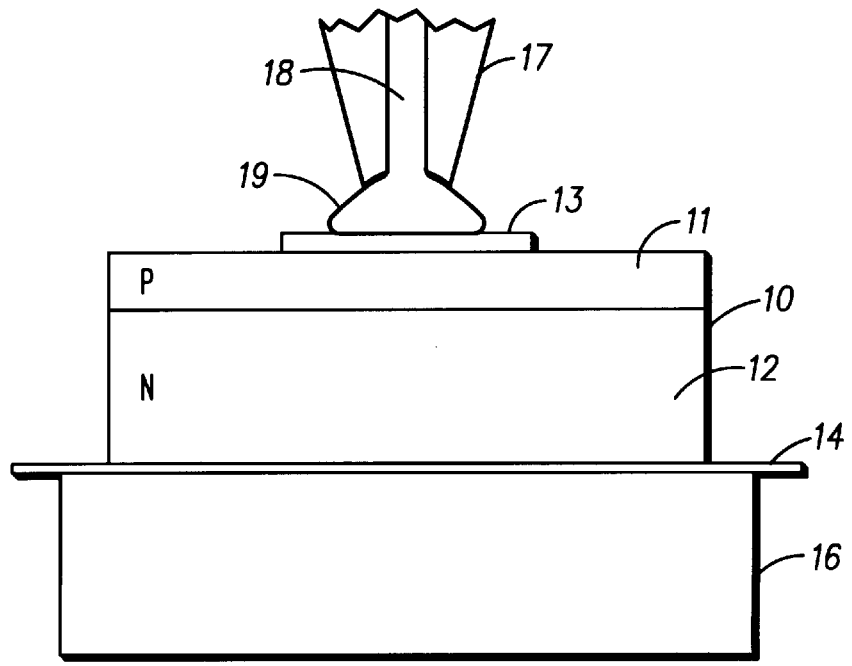
FIG. 2 shows another step in the manufacturing process of the present invention.

The 90 gram force applied to ball 19 causes ball 19 to flatten out as illustrated in FIG. 2 to become a flattened tip 19. The flattened surface of ball 19 spreads the area that is being rubbed by the vibrating or ultrasonic energy and does not create a crater in contact pad 13. Also note that the vibrating displacement used in this first step is less than in the prior art process. Previously, it was thought that a high force such as 90 grams applied through ball 19 would cause damage to the semiconductor device, especially a III–V compound semiconductor device such as gallium arsenide. However the low displacement power setting probably reduces the chance of a failure, yet a low displacement setting alone results in a poor bond to contact pad 13.

The second step in the present invention, involves decreasing the force applied to ball 19 to approximately 26 grams and increasing the ultrasonic displacement to a setting of approximately 60 which is higher than used in the prior art single step process. This step takes approximately five milliseconds. This results in a good reliable bond between wire 18 and contact pad 13. Also no cratering was created thus no cracking of contact pad 13 or of P region 11. The resulting size of flattened end or ball 19 is approximately 10.2 micrometers or about thirty-five percent larger in area than in the prior art one step process.

By now it should be appreciated that there has been provided an improved wire bond between a wire and a semiconductor device. The process can be considered a two step process, and yet takes a little less time than the old one step process. This new two step process virtually eliminates any cratering of the contact pad, thereby resulting in a more reliable wire bond.

What is claimed is:

1. A two step method of wire bonding to a pad on a semiconductor device, comprising:

providing a wire to be bonded to the pad, wherein the wire has a rounded tip;

contacting the rounded tip to the pad with sufficient force to flatten the rounded tip thereby providing a flattened tip;

ultrasonically bonding the flattened tip to the pad;

providing a first force during the contacting step along with a reduced ultrasonic displacement; and providing a second force which is less than the first force and using an ultrasonic displacement which is higher than the reduced ultrasonic displacement to perform the ultrasonically bonding step, wherein providing the first force occurs for approximately six milliseconds, and providing the second force occurs for approximately five milliseconds.

2. A two step process of bonding a wire to a contact pad, wherein the contact pad is located on a surface of a semiconductor device and the wire has a tip that is a ball configuration, comprising:

pressing the wire onto the contact pad with sufficient force to flatten the ball configuration of the wire so that the tip of the wire is flattened and approximately thirty-five percent larger in diameter;

reducing the force to complete bonding the tip of the wire to the contact pad by using ultrasonic bonding; and performing the step of pressing the wire onto the contact pad for approximately six milliseconds, and reducing the force during bonding the tip of the wire to the contact pad for approximately five milliseconds.

\* \* \* \* \*